(12) United States Patent
Mullick et al.

(10) Patent No.: US 10,892,183 B2
(45) Date of Patent: Jan. 12, 2021

(54) METHODS FOR REMOVING METAL OXIDES

(71) Applicant: Micromaterials LLC, Wilmington, DE (US)

(72) Inventors: Amrita B. Mullick, Santa Clara, CA (US); Uday Mitra, Cupertino, CA (US); Regina Freed, Los Altos, CA (US)

(73) Assignee: Micromaterials LLC, Wilmington, DE (US)

( * ) Notice: Subject to any disclaimer, the term of this patent is extended or adjusted under 35 U.S.C. 154(b) by 0 days.

(21) Appl. No.: 16/290,032

(22) Filed: Mar. 1, 2019

(65) Prior Publication Data

US 2019/0273019 A1    Sep. 5, 2019

Related U.S. Application Data

(60) Provisional application No. 62/637,730, filed on Mar. 2, 2018.

(51) Int. Cl.
*H01L 21/311* (2006.01)
*H01L 21/768* (2006.01)
*H01L 21/3213* (2006.01)

(52) U.S. Cl.
CPC .. *H01L 21/76814* (2013.01); *H01L 21/31111* (2013.01); *H01L 21/31144* (2013.01); *H01L 21/32134* (2013.01); *H01L 21/76831* (2013.01); *H01L 21/76883* (2013.01); *H01L 21/76897* (2013.01)

(58) Field of Classification Search
None
See application file for complete search history.

(56) References Cited

U.S. PATENT DOCUMENTS

| | | | |
|---|---|---|---|
| 4,671,970 A | 6/1987 | Keiser et al. | |
| 4,992,135 A * | 2/1991 | Doan | C23F 1/38 216/100 |
| 5,198,389 A * | 3/1993 | van der Putten | H01L 21/288 257/E21.174 |
| 5,824,597 A | 10/1998 | Hong | |
| 6,130,151 A | 10/2000 | Lin et al. | |

(Continued)

FOREIGN PATENT DOCUMENTS

| | | |
|---|---|---|
| JP | 2008108757 A | 5/2008 |
| JP | 2011060803 A | 3/2011 |

(Continued)

OTHER PUBLICATIONS

Williams, Kirt R., et al., "Etch Rates for Micromachining Processing—Part II", Journal of Microelectromechanical Systems, vol. 12, No. 6, Dec. 2003, pp. 761-778.

(Continued)

*Primary Examiner* — Shamim Ahmed
(74) *Attorney, Agent, or Firm* — Servilla Whitney LLC

(57) ABSTRACT

Methods to remove metal oxides from substrate surfaces are described. Some embodiments of the disclosure utilize an aqueous alkaline solution to remove metal oxides from substrate surfaces using a wet method. Some embodiments of the disclosure are performed at atmospheric pressure and lower temperatures. Methods of forming self-aligned vias are also described.

16 Claims, 10 Drawing Sheets

(56) References Cited

U.S. PATENT DOCUMENTS

| | | | |
|---|---|---|---|
| 6,143,653 A * | 11/2000 | Tsai | H01L 21/31133 |
| | | | 257/E21.255 |
| 6,277,738 B1 | 8/2001 | Choi et al. | |
| 6,528,884 B1 | 3/2003 | Lopatin et al. | |
| 6,576,113 B1 | 6/2003 | Scherer et al. | |
| 6,653,200 B2 | 11/2003 | Olsen | |
| 7,192,803 B1 | 3/2007 | Lin et al. | |
| 7,279,119 B2 | 10/2007 | Hellring et al. | |
| 7,288,463 B1 | 10/2007 | Papasouliotis | |
| 7,541,297 B2 | 6/2009 | Mallick et al. | |
| 7,985,977 B2 | 7/2011 | Gogoi et al. | |
| 8,034,705 B2 | 10/2011 | Choi et al. | |
| 8,338,225 B2 | 12/2012 | Breitwisch et al. | |
| 8,575,753 B2 | 11/2013 | Choi et al. | |
| 8,951,429 B1 | 2/2015 | Liu et al. | |
| 9,012,322 B2 | 4/2015 | Duong et al. | |
| 9,117,884 B1 | 8/2015 | Shaviv et al. | |
| 9,236,292 B2 | 1/2016 | Romero et al. | |
| 9,312,220 B2 | 4/2016 | Lu et al. | |
| 9,324,650 B2 | 4/2016 | Edelstein et al. | |
| 9,362,165 B1 | 6/2016 | Bouche et al. | |
| 9,362,413 B2 | 6/2016 | Yu et al. | |
| 9,368,395 B1 | 6/2016 | Wei et al. | |
| 9,490,202 B2 | 11/2016 | Lin et al. | |
| 9,666,451 B2 | 5/2017 | Wallace et al. | |
| 9,679,781 B2 | 6/2017 | Abatchez et al. | |
| 9,721,888 B2 | 8/2017 | Chang et al. | |
| 9,837,314 B2 | 12/2017 | Smith et al. | |
| 10,083,834 B2 | 9/2018 | Thompson et al. | |
| 10,319,604 B2 | 6/2019 | Duan et al. | |
| 10,319,636 B2 | 6/2019 | Basu et al. | |
| 2002/0098642 A1 | 7/2002 | Harris et al. | |
| 2002/0115296 A1 * | 8/2002 | Wu | H01L 21/31116 |
| | | | 438/694 |
| 2002/0163081 A1 | 11/2002 | Aoyama | |
| 2003/0129846 A1 * | 7/2003 | Liu | H01L 21/31111 |
| | | | 438/698 |
| 2003/0143862 A1 | 7/2003 | Iyer | |
| 2003/0207561 A1 * | 11/2003 | Dubin | H01L 21/288 |
| | | | 438/630 |
| 2004/0067649 A1 | 4/2004 | Hellring et al. | |
| 2004/0192034 A1 | 9/2004 | Ohiwa et al. | |
| 2005/0121768 A1 | 6/2005 | Edelstein et al. | |
| 2005/0167846 A1 | 8/2005 | Aoyama | |
| 2005/0266627 A1 | 12/2005 | Furukawa et al. | |
| 2006/0169576 A1 | 8/2006 | Brown et al. | |
| 2006/0286806 A1 | 12/2006 | Ohkuni et al. | |
| 2007/0054482 A1 | 3/2007 | Nakajima et al. | |
| 2007/0108404 A1 * | 5/2007 | Stewart | C11D 7/08 |
| | | | 252/79.1 |
| 2007/0166981 A1 | 7/2007 | Furukawa et al. | |
| 2007/0199922 A1 | 8/2007 | Shen et al. | |
| 2008/0160783 A1 | 7/2008 | Watanabe et al. | |
| 2008/0182411 A1 | 7/2008 | Elers | |
| 2008/0242097 A1 | 10/2008 | Boescke et al. | |
| 2009/0017631 A1 | 1/2009 | Bencher | |
| 2009/0072409 A1 | 3/2009 | Nitta et al. | |
| 2009/0174040 A1 | 7/2009 | Gogoi et al. | |
| 2009/0269569 A1 | 10/2009 | Fucsko et al. | |
| 2010/0078617 A1 | 4/2010 | Breitwisch et al. | |
| 2010/0096691 A1 | 4/2010 | Shin et al. | |
| 2010/0171220 A1 | 7/2010 | Cheng-Lin | |
| 2010/0173494 A1 | 7/2010 | Kobrin | |
| 2010/0203725 A1 | 8/2010 | Choi et al. | |
| 2010/0301480 A1 | 12/2010 | Choi et al. | |
| 2010/0330805 A1 | 12/2010 | Doan et al. | |
| 2011/0049568 A1 | 3/2011 | Lochtefeld et al. | |
| 2011/0057317 A1 | 3/2011 | Koike et al. | |
| 2011/0089393 A1 | 4/2011 | Kuo-Pin et al. | |
| 2011/0207318 A1 | 8/2011 | Usami | |
| 2011/0281417 A1 | 11/2011 | Gordon et al. | |
| 2012/0115302 A1 | 5/2012 | Breitwisch et al. | |
| 2012/0156857 A1 | 6/2012 | Cohen | |
| 2012/0178235 A1 | 7/2012 | Pachamuthu et al. | |
| 2013/0072019 A1 | 3/2013 | Ryan | |
| 2013/0109148 A1 | 5/2013 | Oh et al. | |
| 2013/0241037 A1 | 9/2013 | Jeong et al. | |
| 2013/0264533 A1 | 10/2013 | Cheong et al. | |
| 2014/0029181 A1 | 1/2014 | Gstrein | |
| 2014/0264747 A1 | 9/2014 | Barabash | |
| 2014/0264896 A1 | 9/2014 | Wei et al. | |
| 2014/0327140 A1 | 11/2014 | Zhang et al. | |
| 2015/0111374 A1 | 4/2015 | Bao et al. | |
| 2015/0132901 A1 | 5/2015 | Wang et al. | |
| 2015/0137113 A1 | 5/2015 | Yu et al. | |
| 2015/0170956 A1 | 6/2015 | Naik et al. | |
| 2015/0279736 A1 | 10/2015 | Hotta et al. | |
| 2015/0287675 A1 | 10/2015 | Shaviv | |
| 2015/0325622 A1 | 11/2015 | Zhang et al. | |
| 2015/0357439 A1 | 12/2015 | Liu et al. | |
| 2015/0364420 A1 | 12/2015 | Mei et al. | |
| 2015/0371896 A1 | 12/2015 | Chen et al. | |
| 2016/0049427 A1 | 2/2016 | Zang | |
| 2016/0056074 A1 | 2/2016 | Na | |
| 2016/0056104 A1 | 2/2016 | Bouche et al. | |
| 2016/0068710 A1 | 3/2016 | Wang et al. | |
| 2016/0093635 A1 | 3/2016 | Rabkin et al. | |
| 2016/0111342 A1 | 4/2016 | Huang et al. | |
| 2016/0141416 A1 | 5/2016 | Mariani et al. | |
| 2016/0163587 A1 | 6/2016 | Backes et al. | |
| 2016/0163640 A1 | 6/2016 | Edelstein et al. | |
| 2016/0190008 A1 | 6/2016 | Chandrashekar et al. | |
| 2016/0190009 A1 | 6/2016 | Wallace et al. | |
| 2016/0260779 A1 | 9/2016 | Kawashima et al. | |
| 2017/0076945 A1 | 3/2017 | Hudson | |
| 2017/0077037 A1 | 3/2017 | Kelly et al. | |
| 2017/0186849 A1 | 6/2017 | Chen et al. | |
| 2017/0263563 A1 | 9/2017 | Dutta et al. | |
| 2017/0338149 A1 | 11/2017 | Lin | |
| 2017/0358483 A1 | 12/2017 | Roy et al. | |
| 2018/0096847 A1 | 4/2018 | Thompson et al. | |
| 2018/0130671 A1 | 5/2018 | Duan et al. | |
| 2018/0144980 A1 * | 5/2018 | Basu | H01L 21/76879 |
| 2018/0346851 A1 * | 12/2018 | Moon | C11D 7/10 |
| 2018/0358260 A1 * | 12/2018 | Roy | H01L 21/7682 |

FOREIGN PATENT DOCUMENTS

| | | |
|---|---|---|
| JP | 2011233922 A | 11/2011 |
| JP | 6039848 B1 | 12/2016 |
| KR | 100223334 B1 | 10/1999 |
| KR | 20000026588 A | 5/2000 |
| KR | 20020020969 A | 3/2002 |
| WO | 2016/106092 A1 | 6/2016 |
| WO | 2017136577 A1 | 8/2017 |
| WO | 2018187431 A1 | 10/2018 |
| WO | 2019046402 A1 | 3/2019 |
| WO | 2019050735 A1 | 3/2019 |

OTHER PUBLICATIONS

PCT International Search Report and Written Opinion in PCT/US2017/037141 dated Aug. 31, 2017, 11 pages.
PCT International Search Report and Written Opinion in PCT/US2017/053936 dated Jan. 12, 2018, 10 pages.
PCT International Search Report and Written Opinion in PCT/US2017/059737 dated May 18, 2018, 11 pages.
PCT International Search Report and Written Opinion in PCT/US2017/060367 dated Feb. 22, 2018, 9 pages.
PCT International Search Report and Written Opinion in PCT/US2017/060368 dated Jan. 31, 2018, 11 pages.
PCT International Search Report and Written Opinion in PCT/US2018/019146 dated May 23, 2018, 12 pages.
PCT International Search Report and Written Opinion in PCT/US2018/027284 dated Aug. 2, 2018, 10 pages.
PCT international Search Report and Written Opinion in PCT/US2018/036690 dated Sep. 18, 2018, 9 pages.
PCT International Search Report and Written Opinion in PCT/US2018/048503 dated Dec. 14, 2018, 10 pages.
PCT International Search Report and Written Opinion in PCT/US2018/048504 dated Dec. 13, 2018, 10 pages.

(56) References Cited

OTHER PUBLICATIONS

PCT International Search Report and Written Opinion in PCT/US2018/048509 dated Dec. 13, 2018, 10 pages.
PCT ISR & Written Opinion for PCT/US2018/026026, dated Jul. 26, 2018, 11 pages.

\* cited by examiner

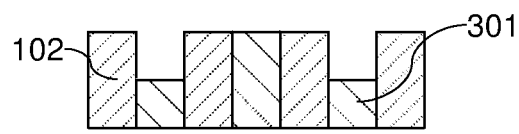
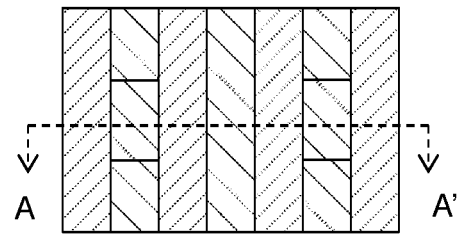
FIG. 6A  FIG. 6B
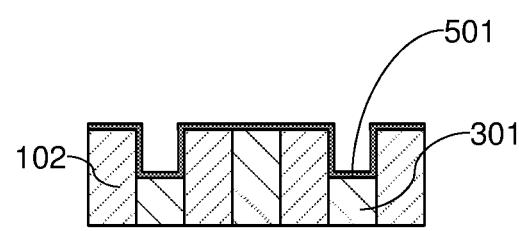
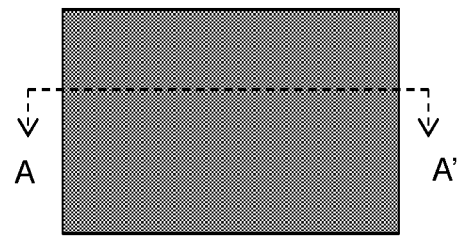
FIG. 7A  FIG. 7B
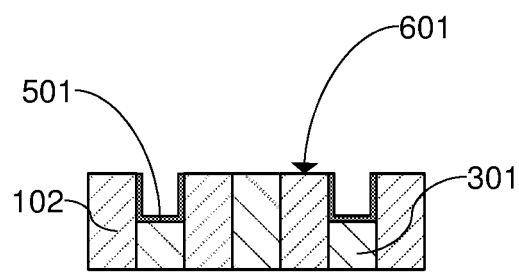
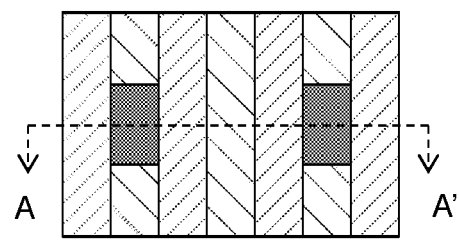
FIG. 8A  FIG. 8B

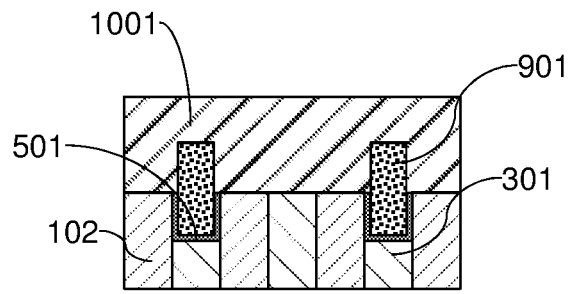 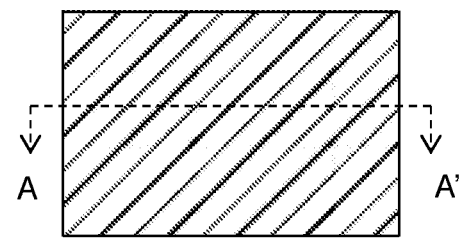
FIG. 12A                FIG. 12B
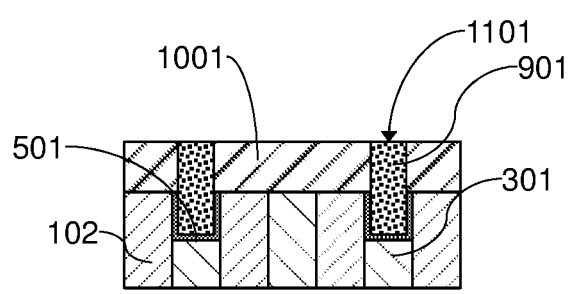 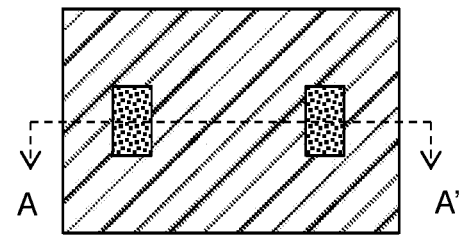
FIG. 13A                FIG. 13B
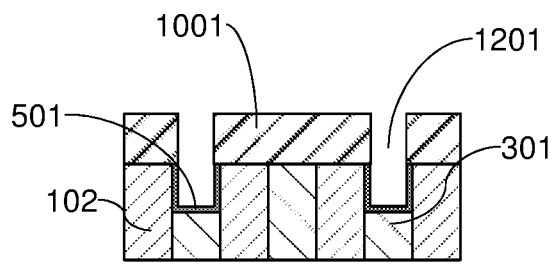 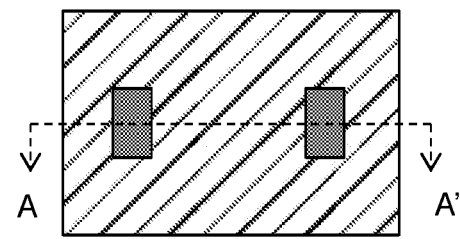
FIG. 14A                FIG. 14B

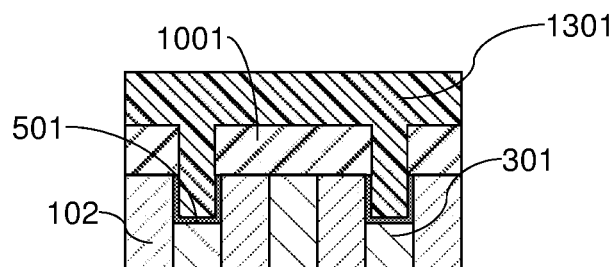
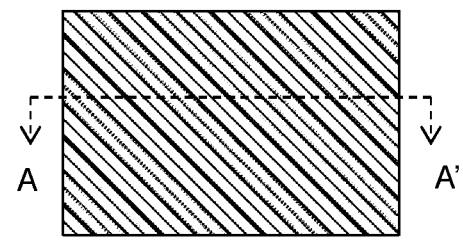
FIG. 15A FIG. 15B
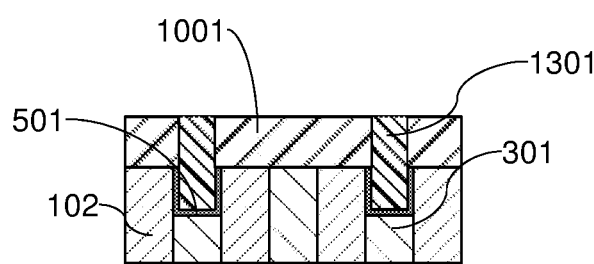
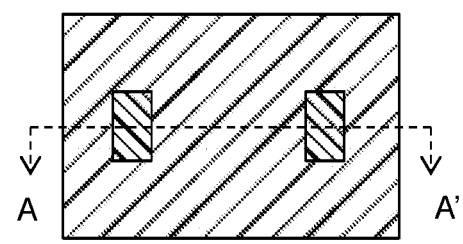
FIG. 16A FIG. 16B
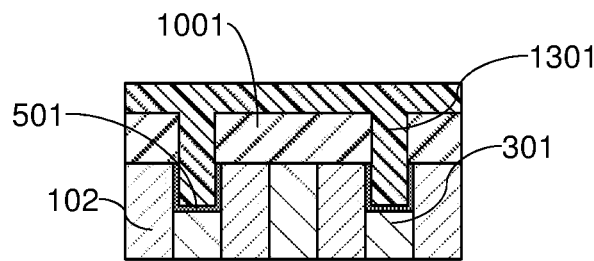
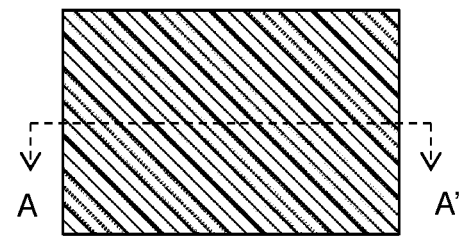
FIG. 17A FIG. 17B

METHODS FOR REMOVING METAL OXIDES

CROSS-REFERENCE TO RELATED APPLICATIONS

This application claims priority to U.S. Provisional Application No. 62/637,730, filed Mar. 2, 2018, the entire disclosure of which is hereby incorporated by reference herein.

FIELD

Embodiments of the disclosure generally relate to methods for removing metal oxide materials from substrates. Additional embodiments relate to methods of producing vias which are self-aligned such that conductive layers with lines running in opposing directions are connected.

BACKGROUND

Dry methods of removing metal oxides (e.g. tungsten oxides, $WO_x$) are well established for many materials. Metal halides can remove metal oxides through a thermal method. For example, $WO_x$ can be removed by $WCl_5$, $WF_6$, and other chlorine based chemicals. Other methods utilize plasma reactants. For example, a plasma of chlorine gas ($Cl_2$) can also be used to remove $WO_x$. However, there remains a need for additional processes, specifically those that can be carried out without vacuum, plasma or other extraordinary process conditions.

Typically in integrated circuit manufacturing, the patterning of the metal lines in a metallization layer is performed independently from the vias above or below that metallization layer. Conventional via manufacturing techniques, however, cannot provide full via self-alignment. In the conventional techniques, the vias formed to connect lines in an upper metallization layer to a lower metallization are often misaligned to the lines in the lower metallization layer. This misalignment increases via resistance and leads to potential shorting to the wrong metal line. These errors can cause device failures, decreased yields and increased manufacturing costs. Therefore, methods of producing self-aligned vias are also needed.

SUMMARY

One or more embodiments of the disclosure are directed to a method comprising providing a substrate having a dielectric substrate surface with at least one feature formed therein. The at least one feature extends a distance from the substrate surface into the substrate and has a sidewall and a bottom. The at least one feature also has a first metal oxide film therein. The substrate is exposed to an aqueous alkaline solution to remove the first metal oxide film from the feature without affecting the substrate surface adjacent to the feature.

Additional embodiments of the disclosure are directed to a method comprising providing a substrate having a substrate surface with at least one feature formed therein. The at least one feature extends a distance from the substrate surface into the substrate and has a sidewall and bottom. The at least one feature has an aspect ratio greater than or equal to about 10:1. The at least one feature has a tungsten oxide film therein. The substrate is exposed to an aqueous hydroxide solution to remove the tungsten oxide film from the feature without affecting the substrate surface adjacent to the feature. The substrate is rinsed with a solution comprising water and isopropyl alcohol.

Further embodiments of the disclosure are directed to a method to provide a self-aligned via. The method comprises providing a substrate with a plurality of first conductive lines between a plurality of first insulating layers which are substantially coplanar and extend along a first direction. Portions of the first conductive lines are recessed. A liner is deposited on the recessed portions of the first conductive lines. A first metal film is formed on the liner. The first metal film is oxidized to form pillars comprising an oxide of the first metal film. A second insulating layer is deposited around the pillars. The pillars are removed to form vias in the second insulating layer by exposing the substrate to an aqueous alkaline solution to remove the pillars and the first metal film without affecting the first insulating layers, the liner or the second insulating layer.

BRIEF DESCRIPTION OF THE DRAWINGS

So that the manner in which the recited features of the present disclosure can be understood in detail, a more particular description of the disclosure may be had by reference to several embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 6A is a side cross-sectional view of the electronic device structure after a mask layer is removed according to some embodiments;

FIG. 6B is a top view of the electronic device structure of FIG. 6A;

FIG. 7A is a side cross-sectional view of the electronic device structure after a liner is deposited on the insulating layers and the recessed conductive lines according to some embodiments;

FIG. 7B is a top view of the electronic device structure of FIG. 7A;

FIG. 8A is a side cross-sectional view of the electronic device structure after portions of the liner are removed from the insulating layers according to some embodiments;

FIG. 8B is a top view of the electronic device structure of FIG. 8A;

FIG. 12A is a side cross-sectional view of the electronic device structure after depositing the second insulating material according to some embodiments;

FIG. 12B is a top view of the electronic device structure shown in FIG. 12A;

FIG. 13A is a side cross-sectional view of the electronic device structure after excess second insulating material is removed to expose the top of the pillars according to some embodiments;

FIG. 13B is a top view of the electronic device structure shown in FIG. 13A;

FIG. 14A is a side cross-sectional view of the electronic device structure after the pillars have been removed according to some embodiments;

FIG. 14B is a top view of the electronic device structure shown in FIG. 14A;

FIG. 15A is a side cross-sectional view of the electronic device structure after depositing a third insulating layer according to some embodiments;

FIG. 15B is a top view of the electronic device structure shown in FIG. 15A;

FIG. 16A is a side cross-sectional view of the electronic device structure after removing an overburden of the third insulating layer according to some embodiments;

FIG. 16B is a top view of the electronic device structure shown in FIG. 16A;

FIG. 17A is a side cross-sectional view of the electronic device structure after depositing the third insulating layer to a predetermined depth according to some embodiments;

FIG. 17B is a top view of the electronic device structure shown in FIG. 17A;

DETAILED DESCRIPTION

Figure 1A:
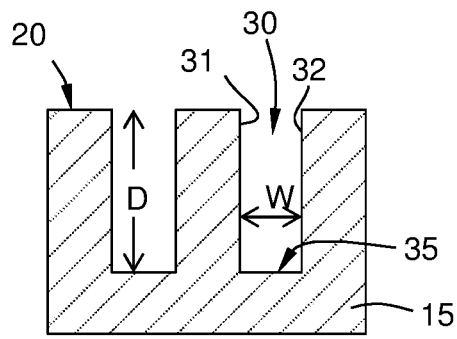
FIG. 1A illustrates a side cross-sectional view of a substrate with a feature according to some embodiments.

In the following description, numerous details, such as materials, chemistries, dimensions of the elements, etc., are set forth in order to provide a thorough understanding of one or more of the embodiments of the present disclosure. One of ordinary skill in the art will understand that the one or more embodiments of the disclosure may be practiced without these details. In other instances, semiconductor fabrication processes, techniques, materials, equipment, etc., have not been described in detail to avoid unnecessarily the obscuring of this description. Those of ordinary skill in the art, with the included description, will be able to implement appropriate functionality without undue experimentation.

While certain exemplary embodiments of the disclosure are described and shown in the accompanying drawings, it is to be understood that such embodiments are merely illustrative and not restrictive of the current disclosure, and that this disclosure is not restricted to the specific constructions and arrangements shown and described because modifications may occur to those ordinarily skilled in the art.

Reference throughout this disclosure to "one embodiment", "another embodiment", or "an embodiment" means that a particular feature, structure, or characteristic described in connection with the embodiment is included in at least one embodiment of the present disclosure. Thus, the appearance of phrases like "in one embodiment" or "in an embodiment" in various places throughout the specification are not necessarily all referring to the same embodiment of the disclosure. Furthermore, the particular features, structures, or characteristics may be combined in any suitable manner in one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure advantageously provide methods for removing metal oxides. Some embodiments of the disclosure advantageously provide methods for removing metal oxides which remove both metals and metal oxides. Some embodiments of the disclosure advantageously provide methods of removing metal oxides which can be performed at atmospheric pressure and/or at lower substrate temperatures. Some embodiments of the disclosure advantageously provide methods of removing metal oxides which can be performed without the use of harsh reactants (e.g. plasma). Some embodiments of the disclosure advantageously provide methods of removing metal oxides which can be performed without purging the reaction chamber.

One or more embodiments provide self-aligned vias that advantageously eliminate misalignment issues and avoid shorting to the wrong metal line. The self-aligned vias of some embodiments provide lower via resistance and capacitance benefits over the conventional vias. Some embodiments of the disclosure provide full alignment between the vias and the conductive lines of the metallization layers. Some embodiments of the disclosure provide self-aligned via that are substantially error free and advantageously increase the device yield and reduce the device cost.

Some embodiments of this disclosure provide methods of removing a metal oxide film from a substrate feature (e.g., trench or via) without affecting the substrate surface adjacent to the feature. Stated differently, some embodiments of this disclosure provide methods of selectively etching a metal oxide film from a substrate feature relative to a dielectric (e.g. SiN).

Some of the methods described herein are considered wet methods, more specifically wet etching methods. As used herein, "wet methods" are those methods which rely on the use of liquid phase reactants. These methods are in contrast to "dry methods" which do not rely on liquid reactants and instead rely on gaseous reactants (thermal or ion-containing) or no reactants (e.g. mechanical etch methods).

Figure 1B:
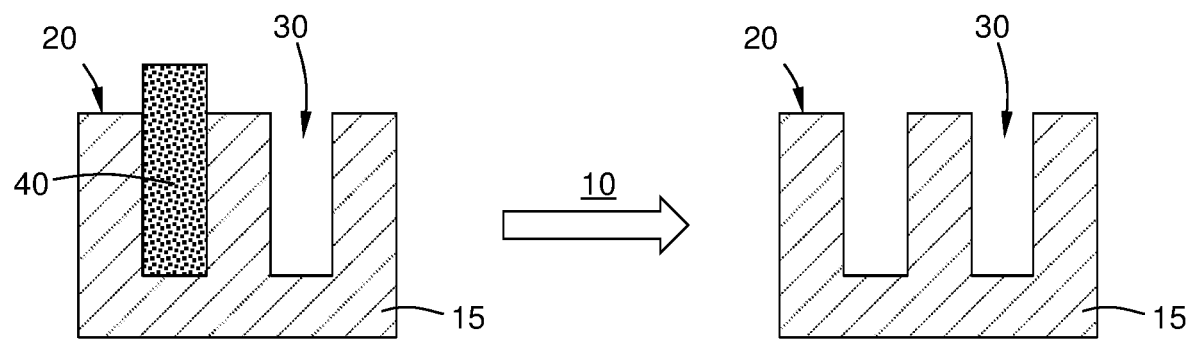
FIG. 1B illustrates a side cross-sectional view of a substrate with a first metal oxide film within a feature during processing according to some embodiments.
Figure 1C:
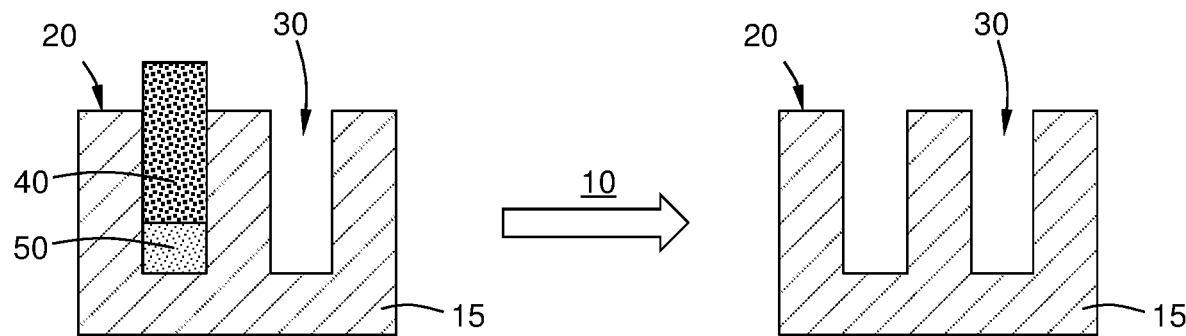
FIG. 1C illustrates a side cross-sectional view of a substrate with a first metal oxide film and a first metal film within a feature during processing according to some embodiments.

One or more embodiments of the disclosure are directed to methods for removing metal oxides from a substrate surface. In some embodiments, the metal oxides are removed from within a feature of the substrate surface. Referring to FIGS. 1A through 1C, one or more embodiments of the disclosure are directed to a method 10 comprising providing a substrate 15 having a dielectric substrate surface 20 with at least one feature 30 formed therein. For clarity, FIG. 1A illustrates a substrate 15 without any materials within the feature 30.

In general, the Figures show substrates having two features for illustrative purposes; however, those skilled in the art will understand that there can be no, fewer or more than two features. As used in this regard, the term "feature" means any intentional surface irregularity. The shape of the feature 30 can be any suitable shape. Suitable examples of features include, but are not limited to trenches which have a top, two sidewalls and a bottom, peaks which have a top and two sidewalls extending upward from a surface and vias which have a continuous sidewall extending down from a surface with an open bottom or bottom formed by a different material than the sidewall.

In specific embodiments, the feature 30 is a trench. For purposes of this disclosure, trenches have a top, two sidewalls extending down from a surface to a bottom. As illustrated, each sidewall 31, 32 can be substantially orthogonal to the bottom 35 or can be slanted relative to bottom 35 at an angle other than 90 degrees, so that the opening at the substrate surface 20 is greater than at a lower portion of the feature 30.

In some embodiments, the feature 30 extends into the substrate 15 a distance D from the substrate surface 20 to a bottom 35. The feature 30 has a first sidewall 31 and a second sidewall 32 that define a width W of the feature 30.

The aspect ratio of a feature is the ratio of the depth D of the feature relative to the width W of the feature. A higher aspect ratio feature will have a narrower/longer shape than a lower aspect ratio feature. In some embodiments, the features have an aspect ratio greater than or equal to about 3:1, 4:1, 5:1, 6:1, 7:1, 8:1, 9:1, 10:1, 15:1, 20:1, 25:1 or 30:1.

As illustrated in FIG. 1B, in some embodiments, a feature 30 has a first metal oxide film 40 therein. In some embodiments, the first metal oxide film 40 extends above the substrate surface 20. In some embodiments, the first metal oxide film 40 is substantially coplanar with the substrate surface 20. In some embodiments, the first metal oxide film 40 is entirely within the feature 30 so that a top of the first metal oxide film 40 is below the substrate surface 20. The first metal oxide film 40 comprises a first metal. Stated differently, the first metal oxide film comprises an oxide of a first metal. For example, if the first metal comprises tungsten, the first metal oxide would comprise tungsten oxide ($WO_x$).

The first metal may be any suitable metal capable of forming a metal oxide. The first metal may comprise or consist of one or more of Co, Mo, W, Ta, Ti, Ru, Rh, Cu, Fe, Mn, V, Nb, Hf, Zr, Y, Al, Sn, Cr, or La. In some embodiments, the first metal comprises a combination of metals as a metal alloy. In some embodiments, the first metal comprises tungsten. In some embodiments, the first metal consists of tungsten. In some embodiments, the first metal consists essentially of tungsten. As used in this manner, the term "consists essentially of" means that the metal composition of the film is greater than or equal to about 95%, 98% or 99% of the stated metal, on an atomic basis.

The method 10 exposes the substrate 15 to an aqueous alkaline solution to remove the first metal oxide film 40 from the feature 30 without affecting the substrate surface 20 adjacent to the feature 30. Exposing the substrate to the aqueous alkaline solution can be performed by any suitable wet process. In some embodiments, the substrate is exposed to the alkaline aqueous solution by dipping, immersion, or soaking under static or dynamic (i.e., active flowing) conditions.

In some embodiments, the method 10 is performed in ambient conditions (i.e., similar pressure and gas makeup of the processing/manufacturing environment). In some embodiments, the method 10 is performed without to the use of vacuum. In some embodiments, the method 10 is performed without the use of plasma.

As illustrated in FIG. 1C, in some embodiments, a feature 30 has a first metal film 50 and a first metal oxide film 40 is on the first metal film 50. It should be understood by one skilled in the art that the first metal oxide film 40 and the first metal film 50 can comprise the same first metal or can have different metals. In some embodiments, the first metal film 50 comprises the same metal as the first metal oxide film 40.

The method 10 exposes the substrate 15 to an aqueous alkaline solution to remove the first metal oxide film 40 and the first metal film 50 from the feature 30 without affecting the substrate surface 20 adjacent to the feature 30.

In some embodiments, the first metal film 50 is formed in the feature 30 and the first metal film 50 is partially oxidized to form the first metal oxide film 40 on the first metal film 50. Where the first metal film 50 is fully oxidized in the feature 30, there would no longer be a first metal film 50 and the embodiment illustrated in FIG. 1B would result.

In some embodiments, the first metal film 50 is deposited using one of deposition techniques, such as but not limited to an ALD, CVD, PVD, MBE, MOCVD, spin-on, or other deposition techniques known to one of ordinary skill in the art of microelectronic device manufacturing.

Oxidizing the first metal film 50 can be done by any suitable method or technique. In some embodiments, the first metal film 50 is oxidized by exposure to an oxidizing agent or oxidizing conditions to transform the first metal film 50 the first metal oxide film 40. The skilled artisan will recognize that oxidation of the film can be chemical oxidation (i.e., addition of oxygen atoms) or electrochemical oxidation (i.e., removal of electrons from a zero valent metal to form an oxidized metal). The oxidizing agent can be any suitable oxidizing agent including, but not limited to, $O_2$, $O_3$, $N_2O$, $H_2O$, $H_2O_2$, CO, $CO_2$, $NH_3$, $N_2/Ar$, $N_2/He$, $N_2/Ar/He$ or any combination thereof. In some embodiments, the oxidizing conditions comprise a thermal oxidation, plasma enhanced oxidation, remote plasma oxidation, microwave and radio-frequency oxidation (e.g., inductively coupled plasma (ICP), capacitively coupled plasma (CCP)). In some embodiments, oxidizing the first metal film 50 results in the formation of a film comprising atoms of the first metal and oxygen atoms, or a film that consists essentially of first metal atoms and oxygen atoms. As used in this manner, the term "consists essentially of" means that the composition of the film is greater than or equal to about 95%, 98%, 99% or 99.5% of the stated elements, in any suitable ratio.

In some embodiments, the first metal oxide film 40 is formed by oxidation of the first metal film 50 at any suitable temperature depending on, for example, the composition of the first metal film 50 and the oxidizing agent. In some embodiments, the oxidation occurs at a temperature in the range of about 25° C. to about 800° C. In some embodiments, the oxidation of the first metal film 50 occurs at a temperature greater than or equal to about 50° C., 100° C., 150° C., 200° C., 250° C., 300° C., 350° C., 400° C., 450° C., 500° C., 550° C., 600° C., 650° C., 700° C., 750° C. or 800° C.

In some embodiments, the feature 30 comprises a liner. As used in this regard, a feature which comprises a liner has a liner positioned between the substrate and a film or other material deposited within the feature. In some embodiments, the liner is positioned on the sidewalls 31, 32 of the feature 30. In some embodiments, the liner is positioned on the sidewalls 31, 32 and the bottom 35 of the feature 30. In some embodiments, the liner is also positioned on the substrate surface 20 outside of the feature 30.

In some embodiments, the liner is deposited to protect neighboring materials from changing properties in a later process or to act as an etch stop in a later process. In some embodiments, the liner is deposited to prevent etching of a material under the liner. In some embodiments, the liner is a conductive liner. In another embodiment, liner is a non-conductive liner. In some embodiments, when the liner is a non-conductive liner, the method further comprises removing the liner in a later process, as described in further detail below. In some embodiments, the liner comprises substantially no metal. As used in this regard, "comprises substantially no metal" means that the liner comprises less than 2%, 1% or 0.5% metal on an atomic basis. In some embodiment, the liner is a nitride, e.g., silicon nitride (SiN). In some embodiments, the liner comprises one or more of SiN or SiCN. In an embodiment, the liner has a thickness in a range of about 0.1 nm to about 50 nm, or in the range of about 0.5 nm to about 30 nm, or in the range of about 1 nm to about 20 nm.

Figure 2A:
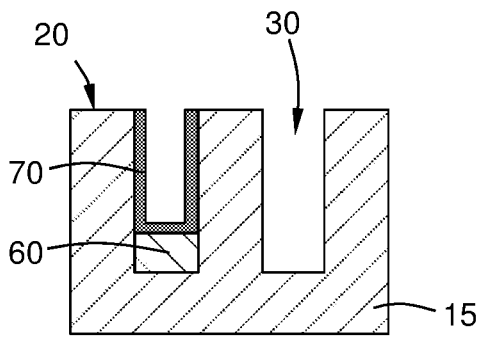
FIG. 2A illustrates a side cross-sectional view of a substrate with a feature, a second metal film and a liner according to some embodiments.
Figure 2B:
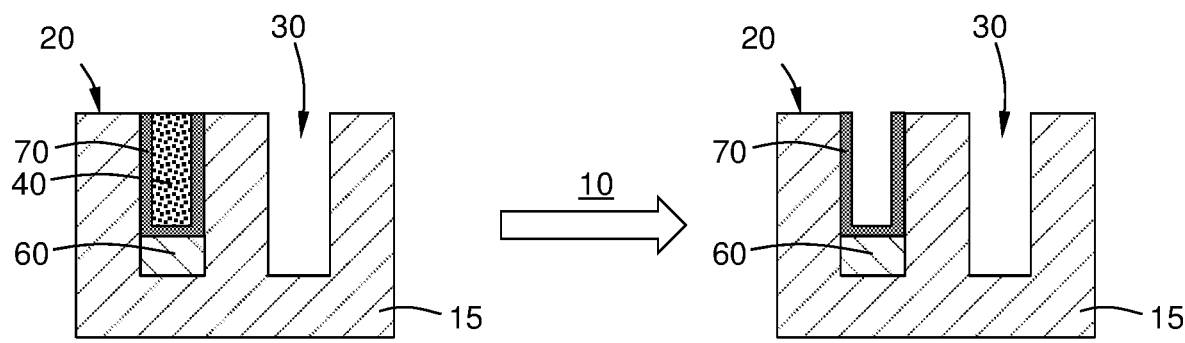
FIG. 2B illustrates a side cross-sectional view of a substrate with a first metal oxide film and a second metal film beneath a liner within a feature during processing according to some embodiments.
Figure 2C:
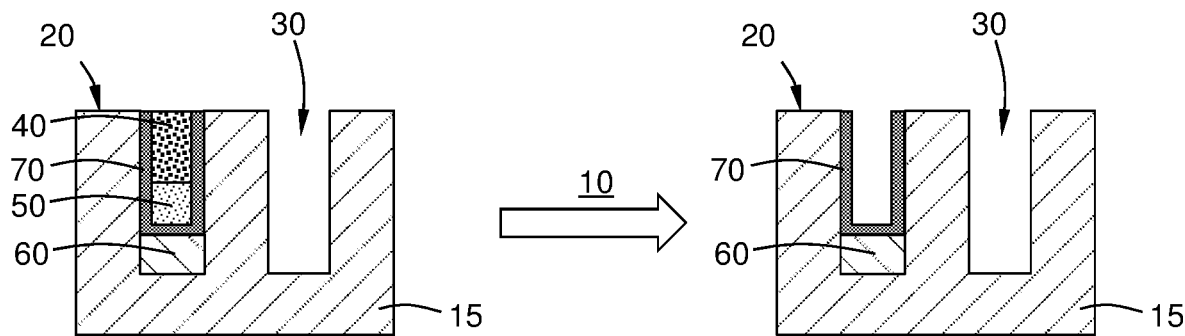
FIG. 2C illustrates a side cross-sectional view of a substrate with feature containing a second metal film beneath a liner and first metal oxide film and a first metal film on a liner during processing according to some embodiments.

As illustrated in FIGS. 2A through 2C, in some embodiments, a feature 30 comprises a second metal film 60. As illustrated in FIG. 2A, in some embodiments, the second metal film 60 is below a liner 70. In some embodiments (not shown), the substrate surface 20 also has a liner 70. In some embodiments, the liner is only present within the feature 30. In some embodiments, the liner 70 is only present at the bottom of the feature.

The second metal film 60 comprises a second metal. In some embodiments, the second metal is different from the first metal. The second metal may be any suitable metal or metal alloy. In some embodiments, the second metal comprises, consists essentially of or consists of one or more of copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pb), antimony (Sb), bismuth (Bi), zinc (Zn), or cadmium (Cd). In some embodiments, the second metal comprises one or more of copper, cobalt or ruthenium.

As illustrated in FIG. 2B, in some embodiments, a feature 30 has a second metal film 60 below a liner 70 and a first metal oxide film 40 on the liner 70. The method 10 exposes the substrate 15 to an aqueous alkaline solution to remove the first metal oxide film 40 from the feature 30 without affecting the liner 70 or the second metal film 60 underneath. In some embodiments, not shown, the substrate surface 20 adjacent to the feature 30 is also unaffected.

As illustrated in FIG. 2C, in some embodiments, a feature 30 has a second metal film 60 below a liner 70, a first metal film 50 on the liner and a first metal oxide film 40 on the first metal film 50. The method 10 exposes the substrate 15 to an aqueous alkaline solution to remove the first metal oxide film 40 and the first metal film 50 from the feature 30 without affecting the liner 70. In some embodiments, not shown, the substrate surface 20 adjacent to the feature 30 is also unaffected.

The aqueous alkaline solution comprises water and a soluble base. In some embodiments, the aqueous alkaline solution comprises a base with a $pK_b$ of less than or equal to about 5, less than or equal to about 4.8, less than or equal to about 4.75, less than or equal to about 4.7, less than or equal to about 4.5, less than or equal to about 3, less than or equal to about 2, or less than or equal to about 1. In some embodiments, the base comprises an organic base (e.g., pyridine, methyl amine, imidazole, hydroxides of organic cations). In some embodiments, the base comprising a basic salt (e.g., sodium carbonate, sodium acetate, compounds with a weak acid component that hydrolyzes to form a basic solution). In some embodiments, the base comprises an alkali metal. In some embodiments, the base comprises a hydroxide ion. In some embodiments, the base comprises one or more of NaOH, KOH or $NH_4OH$.

In some embodiments, the aqueous alkaline solution has a hydroxide concentration in a range of about 0.1M to about 10M, or about 0.5M to about 5M, or about 1M to about 2M. In some embodiments, the aqueous alkaline solution has a hydroxide concentration of less than or equal to about 10M, less than or equal to about 5M, less than or equal to about 2M, less than or equal to about 1M, less than or equal to about 0.5M, less than or equal to about 0.2M, or less than or equal to about 0.1M.

The method 10 can be performed at any suitable pressure and temperature. In some embodiments, the substrate is exposed to the aqueous alkaline solution at atmospheric pressure (i.e., the pressure of manufacturing or processing environment). The skilled artisan will recognize that atmospheric pressure depends on, for example, altitude and manufacturing air handling conditions. In some embodiments, atmospheric pressure is in the range of about 0.9 atm (684 torr) to about 1.1 atm (836 torr).

During processing, the substrate can be heated or cooled. Such heating or cooling can be accomplished by any suitable means including, but not limited to, changing the temperature of the substrate support and flowing heated or cooled gases to the substrate surface, heating or cooling the aqueous alkaline solution. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

In some embodiments, the substrate is maintained at a temperature in a range of about room temperature (25° C.) to about 400° C., or in the range of about 50° C. to about 250° C. In some embodiments, the substrate is maintained at a temperature less than or equal to about 400° C., less than or equal to about 350° C., less than or equal to about 300° C., less than or equal to about 250° C., less than or equal to about 200° C., less than or equal to about 150° C., less than or equal to about 100° C., less than or equal to about 50° C., or less than or equal to about 25° C.

In some embodiments, the method 10 is performed within a closed processing volume. For example, a closed processing volume may be an atomic layer deposition processing chamber, or other sealed chamber. In some embodiments, the aqueous alkaline solution boils on the substrate surface and refluxes within the closed processing volume.

Although not shown in the Figures, the method 10 may further comprise rinsing the substrate 15 with an aqueous solution. Without being bound by theory, it is believed that rinsing the substrate with an aqueous solution may advantageously remove any residual alkaline solution, excess salts, reaction products/byproducts, and/or other contaminants. In some embodiments, rinsing the substrate occurs with water or an aqueous solution consists essentially of water (i.e., less than 1% non-water molecules on a molar basis).

In some embodiments, the aqueous solution further comprises an alcohol. In some embodiments, the aqueous solution further comprises isopropyl alcohol. In some embodiments, the ratio of water to isopropyl alcohol is in the range of about 99:1 to about 10:90. In some embodiments, the ratio of water to isopropyl alcohol is less than or equal to about 99:1, less than or equal to about 98:1, less than or equal to about 95:1, less than or equal to about 90:1, less than or equal to about 50:1, less than or equal to about 20:1, less than or equal to about 10:1, less than or equal to about 5:1, less than or equal to about 2:1, less than or equal to about 1:1, or less than or equal to about 1:5.

In some embodiments, the aqueous solution further comprises a neutralizing agent. In some embodiments, the neutralizing agent is a weak acid. In some embodiments, the neutralizing agent is a buffer solution.

One or more embodiments of the disclosure are directed to methods to provide self-aligned vias. A process for forming self-aligned vias is described with reference to FIGS. 3A through 24. In each of FIGS. 3A through 23B, the Figure denoted 'A' shows a cross-sectional view and the Figure denoted 'B' shows a top view of a semiconductor device. The cross-sectional side view of the A Figures is taken along line A-A' illustrated in the respective B Figures. For example, FIG. 3B illustrates a top view of a device structure and FIG. 3A shows a cross-sectional view of the device structure illustrated in FIG. 3B along axis A-A'.

Figure 3A:
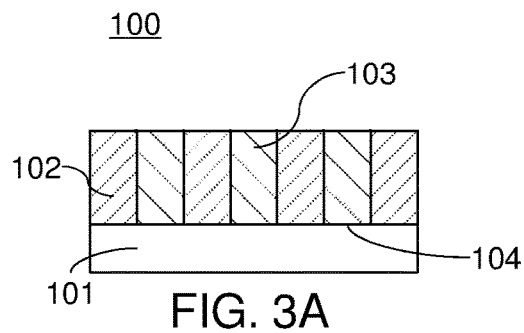
FIG. 3A illustrates a side cross-sectional view of an electronic device structure to provide a self-aligned via according to some embodiments.
Figure 3B:
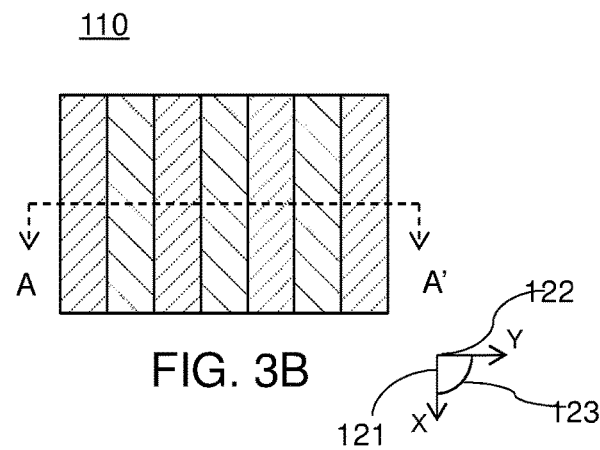
FIG. 3B is a top view of the electronic device structure depicted in FIG. 3A.

FIG. 3A illustrates a cross-sectional view 100 of an electronic device structure to provide a self-aligned via or air gap according to some embodiments. The cross-sectional view 100 is along an axis A-A', as depicted in FIG. 3B. FIG. 3B is a top view 110 of the electronic device structure depicted in FIG. 3A. A lower metallization layer (Mx) comprises a set of conductive lines that extend along an X axis (direction) 121 on a substrate 101, as shown in FIGS. 3A and 3B. As shown in FIG. 3B, X direction 121 crosses a Y axis (direction) 122 at an angle 123. In one or more embodiments, angle 123 is about 90 degrees. In some embodiments, angle 123 is an angle that is other than a 90 degrees angle. The insulating layer 102 comprises trenches 104 which are the gaps between adjacent insulating layers 102. The conductive lines 103 are deposited in trenches 104. The conductive lines comprise the first metal identified above.

In some embodiments, the substrate 101 comprises a semiconductor material, e.g., silicon (Si), carbon (C), germanium (Ge), silicon germanium (SiGe), gallium arsenide (GaAs), InP, GaAs, InGaAs, InAlAs, other semiconductor material, or any combination thereof. In some embodiments, substrate 101 is a semiconductor-on-isolator (SOI) substrate including a bulk lower substrate, a middle insulation layer, and a top monocrystalline layer. The top monocrystalline layer may comprise any material listed above, e.g., silicon. In various embodiments, the substrate 101 can be, for example, an organic, a ceramic, a glass, or a semiconductor substrate. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, substrate 101 includes one or more metallization interconnect layers for integrated circuits. In some embodiments, the substrate 101 includes interconnects, for example, vias, configured to connect the metallization layers. In some embodiments, the substrate 101 includes electronic devices, e.g., transistors, memories, capacitors, resistors, optoelectronic devices, switches, and any other active and passive electronic devices that are separated by an electrically insulating layer. For example, an interlayer dielectric, a trench insulation layer or any other insulating layer known to one of ordinary skill in the art of the electronic device manufacturing. In some embodiments, the substrate includes one or more buffer layers to accommodate for a lattice mismatch between the substrate 101 and one or more layers above substrate 101 and to confine lattice dislocations and defects.

Insulating layer 102 can be any material suitable to insulate adjacent devices and prevent leakage. In some embodiments, electrically insulating layer 102 is an oxide layer, e.g., silicon dioxide, or any other electrically insulating layer determined by an electronic device design. In some embodiments, insulating layer 102 comprises an interlayer dielectric (ILD). In some embodiments, insulating layer 102 is a low-k dielectric that includes, but is not limited to, materials such as, e.g., silicon dioxide, silicon oxide, carbon doped oxide ("CDO"), e.g., carbon doped silicon dioxide, porous silicon dioxide, silicon nitride or any combination thereof.

In some embodiments, insulating layer 102 includes a dielectric material having k value less than 5. In some embodiments, insulating layer 102 includes a dielectric material having k-value less than 2. In some embodiments, insulating layer 102 includes a nitride, oxide, a polymer, phosphosilicate glass, fluorosilicate (SiOF) glass, organosilicate glass (SiOCH), another electrically insulating layer as determined by an electronic device design, or any combination thereof. In some embodiments, insulating layer 102 may include polyimide, epoxy, photodefinable materials, such as benzocyclobutene (BCB), WPR-series materials, and/or spin-on-glass.

In some embodiments, insulating layer 102 is a low-k interlayer dielectric to isolate one metal line from other metal lines on substrate 101. In some embodiments, the thickness of the layer 102 is in an approximate range from about 10 nanometers (nm) to about 2 microns (μm).

In some embodiments, insulating layer 102 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing.

In some embodiments, the lower metallization layer Mx comprising metal lines 103 is a part of a back end metallization of the electronic device. In some embodiments, the insulating layer 102 is patterned and etched using a hard mask to form trenches 104 using one or more patterning and etching techniques known to one of ordinary skill in the art of microelectronic device manufacturing. In some embodiments, the size of trenches in the insulating layer 102 is determined by the size of conductive lines formed later on in a process.

In some embodiments, forming the conductive lines 103 involves filling the trenches 104 with a layer of conductive material, the first metal. In some embodiments, a base layer or liner (not shown) is first deposited on the internal sidewalls and bottom of the trenches 104, and then the conductive layer is deposited on the base layer. In some embodiments, the base layer includes a conductive seed layer (not shown) deposited on a conductive barrier layer (not shown). The seed layer can include copper, and the conductive barrier layer can include aluminum, titanium, tantalum, tantalum nitride, and the like metals. The conductive barrier layer can be used to prevent diffusion of the conductive material from the seed layer, e.g., copper, into the insulating layer 102. Additionally, the conductive barrier layer can be used to provide adhesion for the seed layer (e.g., copper).

In some embodiments, to form the base layer, the conductive barrier layer is deposited onto the sidewalls and bottom of the trenches 104, and then the seed layer is deposited on the conductive barrier layer. In another embodiment, the conductive base layer includes the seed layer that is directly deposited onto the sidewalls and bottom of the trenches 104. Each of the conductive barrier layer and seed layer may be deposited using any thin film deposition technique known to one of ordinary skill in the art of semiconductor manufacturing, e.g., sputtering, blanket deposition, and the like. In one embodiment, each of the conductive barrier layer and the seed layer has the thickness in an approximate range from about 1 nm to about 100 nm. In some embodiments, the conductive barrier layer may be a thin dielectric that has been etched to establish conductivity to the metal layer below. In some embodiments, the conductive barrier layer may be omitted altogether and appropriate doping of the copper line may be used to make a "self-forming barrier".

In some embodiments, the conductive layer e.g., copper, is deposited onto the seed layer of base layer of copper, by an electroplating process. In some embodiments, the conductive layer is deposited into the trenches 104 using a damascene process known to one of ordinary skill in the art of microelectronic device manufacturing. In one embodiment, the conductive layer is deposited onto the seed layer in the trenches 104 using a selective deposition technique, such as but not limited to electroplating, electroless, CVD, PVD, MBE, MOCVD, ALD, spin-on, or other deposition techniques known to one of ordinary skill in the art of microelectronic device manufacturing.

In some embodiments, the choice of a material for conductive layer for the conductive lines 103 determined the choice of a material for the seed layer. For example, if the material for the conductive lines 103 includes copper, the material for the seed layer may also include copper. In some embodiments, the conductive lines 103 include a metal, for example, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pb), antimony (Sb), bismuth (Bi), zinc (Zn), cadmium (Cd), or any combination thereof.

In some embodiments, examples of the conductive materials that may be used for the conductive lines 103 of the metallization layer Mx are, but are not limited to, metals (e.g., copper, tantalum, tungsten, ruthenium, titanium, hafnium, zirconium, aluminum, silver, tin, lead), metal alloys, metal carbides (e.g., hafnium carbide, zirconium carbide, titanium carbide, tantalum carbide, aluminum carbide), other conductive materials, or any combination thereof.

In some embodiments, portions of the conductive layer and the base layer are removed to even out top portions of the conductive lines 103 with top portions of the insulating layer 102 using a chemical-mechanical polishing ("CMP") technique known to one of ordinary skill in the art of microelectronic device manufacturing.

In one non-limiting example, the thickness of the conductive lines 103 is in an approximate range from about 15 nm to about 1000 nm. In one non-limiting example, the thickness of the conductive lines 103 is from about 20 nm to about 200 nm. In one non-limiting example, the width of the conductive lines 103 is in an approximate range from about 5 nm to about 500 nm. In one non-limiting example, the spacing (pitch) between the conductive lines 103 is from about 2 nm to about 500 nm. In more specific non-limiting example, the spacing (pitch) between the conductive lines 103 is from about 5 nm to about 50 nm.

In some embodiments, the lower metallization layer Mx is configured to connect to other metallization layers (not shown). In some embodiments, the metallization layer Mx is configured to provide electrical contact to electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of electronic device manufacturing.

Figure 4A:
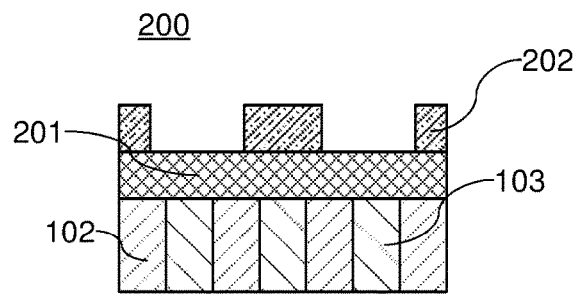
FIG. 4A is a side cross-sectional view of the electronic device structure after a mask layer is formed according to some embodiments.
Figure 4B:
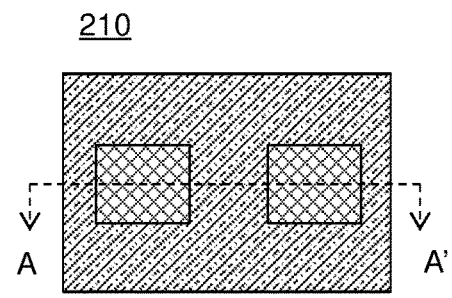
FIG. 4B is a top view of the electronic device structure of FIG. 4A.

FIG. 4A is a view 200 similar to view 100 of FIG. 3A. FIG. 4B is a view 210 similar to FIG. 3B. For simplicity, the substrate 101 is not shown in FIG. 4A or any subsequent drawing. FIG. 4A and FIG. 4B show the electronic device after a first mask 201 and a second mask 202 are deposited over a portion of the electronic device according to some embodiments. A first mask 201 and a second mask 202 are illustrated. Those skilled in the art will recognize that the masking and insulator layers can be single or multiple layers.

For clarity, in some embodiments, the first mask 201 is deposited over the entire electronic device (including the first conducting lines and the first insulating layers). The second mask 202 is deposited over nearly all of the electronic device, except for portions of the first conductive lines as shown in FIG. 4B. Mask 201 and/or mask 202 can be any suitable material. In some embodiments, one or more of mask 201 or mask 202 comprise silicon nitride, silicon oxide, silicon oxynitride, silicon carbide, silicon oxycarbide, silicon carbonitride or silicon oxycarbonitride. In some embodiments, one or more of the mask 201 or the mask 202 comprises a photoresist.

Figure 5A:
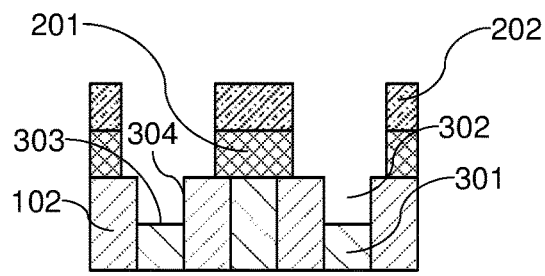
FIG. 5A is a side cross-sectional view of the electronic device structure after a portion of the conductive lines is removed according to some embodiments.
Figure 5B:
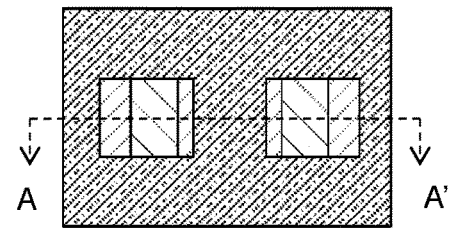
FIG. 5B is a top view of the electronic device structure of FIG. 5A.

FIGS. 5A and 5B are views similar to FIGS. 4A and 4B, respectively, after removing portions of the conductive lines 103 according to some embodiments. The conductive lines 103 and mask 201 can be removed by any suitable technique or combination of techniques. For example an etch process could selectively remove the conductive lines 103 and mask 201 without affecting insulating layer 102.

The conductive lines 103 are recessed to a predetermined depth to form recessed conductive lines 301. As shown in FIGS. 5A and 5B, trenches 302 are formed in the insulating layer 102. Each trench 302 has sidewalls 304 that are portions of insulating layer 102 and a bottom that is a top surface 303 of the recessed conductive line 301.

In some embodiments, the depth of the trenches 302 is from about 10 nm to about 500 nm. In some embodiments, the depth of the trenches 302 is from about 10% to about 100% of the thicknesses of the conductive lines. In some embodiments, the conductive lines 103 are recessed using one or more of wet etching, dry etching, or a combination of techniques known to one of ordinary skill in the art of electronic device manufacturing.

FIGS. 6A and 6B are views similar to FIGS. 5A and 5B, respectively, after removing portions of the mask 201 and mask 202 according to some embodiments. The mask 201 and mask 202 can be removed by any suitable technique or combination of techniques. For example an etch process could selectively remove mask 201 and mask 202 without affecting insulating layer 102 or conductive lines 103.

In some embodiments, the process from FIGS. 4A and 4B to FIGS. 6A and 6B may involve more than one etch process is used to remove portions of the conductive lines 103, mask 201 and mask 202. For example, a first etch process can be used to remove mask 201 and a second etch process can be used to remove mask 202 and portions of the conductive lines 103. In some embodiments, there are three etch processes used to remove the three layers with each etch process selective for one of the layers.

In some embodiments, the process begins with a device as shown in FIGS. 6A and 6B. For example, the device structure may be provided with the recessed conductive lines 301 already formed.

FIGS. 7A and 7B are views similar to FIGS. 6A and 6B, respectively, after a liner 501 is deposited on the electronic device. The liner 501 can be any suitable liner material as described above with respect to FIG. 2A.

FIGS. 8A and 8B are views similar to FIGS. 7A and 7B, respectively, after the liner 501 is removed from the top surface 601 of the electronic device, yet remains in the trenches 302. In some embodiments, the liner is removed using a chemical-mechanical polishing ("CMP") technique known to one of ordinary skill in the art of microelectronic device manufacturing.

In some embodiments, the liner 501 is selectively deposited on the bottom and sidewalls of the trenches 302, as shown in FIG. 8A, without depositing the liner 501 on the top surface of the electronic device. In some embodiments (not shown), the liner 501 is selectively deposited on the bottom of the trenches 302, but not the sidewalls 304.

In some embodiments, liner 501 is deposited to protect the conductive lines 301 from changing the properties later on in a process (e.g., during tungsten deposition, or other processes). In some embodiments, liner 501 is a conductive liner. In another embodiment, liner 501 is a non-conductive liner. In some embodiments, when liner 501 is a non-conductive liner, the liner 501 is removed later on in a process, as described in further detail below. In some embodiments, liner 501 includes titanium nitride (TiN), titanium (Ti), tantalum (Ta), tantalum nitride (TaN), or any combination thereof. In yet another embodiment, liner 501 comprises a nitride (e.g., SiN) or a carbide (e.g., SiC) or a carbonitride (e.g., SiCN). In an embodiment, the liner 501 is deposited to the thickness from about 0.1 nm to about 50 nm.

In some embodiments, the liner 501 is deposited using an atomic layer deposition (ALD) technique. In some embodiments, the liner 501 is deposited using one of deposition techniques, such as but not limited to a CVD, PVD, MBE, MOCVD, spin-on, or other liner deposition techniques known to one of ordinary skill in the art of microelectronic device manufacturing.

Figure 9A:
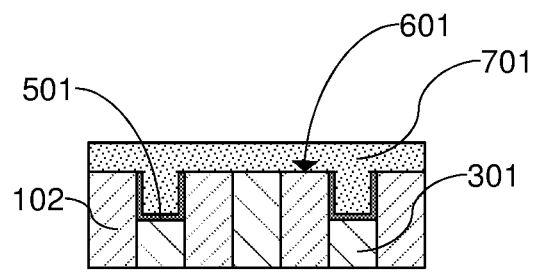
FIG. 9A is a side cross-sectional view of the electronic device structure after a seed gapfill layer is deposited on the liner according to some embodiments.
Figure 9B:
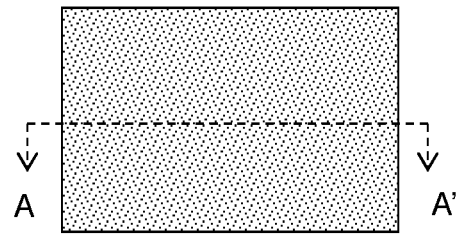
FIG. 9B is a top view of the electronic device structure of FIG. 9A.

FIG. 9A and FIG. 9B are views similar to FIG. 8A and FIG. 8B, respectively, after a first metal film 701 is deposited on the liner 501 according to some embodiments. In some embodiments, first metal film 701 is a self-aligned selective growth seed film. As shown in FIG. 9A and FIG. 9B, first metal film 701 is deposited on liner 501 on the top surface 303 of the recessed conductive lines 301 and the sidewalls 304 of the trenches 302.

In some embodiments, first metal film 701 is a tungsten (W) layer, or other seed gapfill layer to provide selective growth pillars. In some embodiments, first metal film 701 is a metal film or a metal containing film. In some embodiments, first metal film 701 comprises a tungsten (W) and may be referred to as a seed gapfill layer.

In some embodiments, the first metal film 701 is deposited using one of deposition techniques, such as but not limited to an ALD, a CVD, PVD, MBE, MOCVD, spin-on, or other deposition techniques known to one of ordinary skill in the art of microelectronic device manufacturing.

Figure 10A:
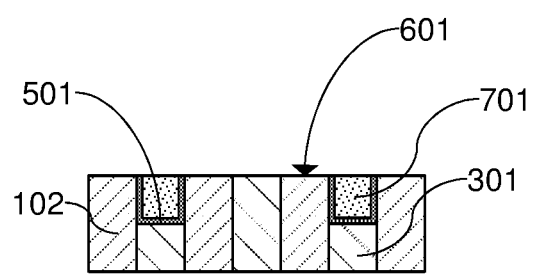
FIG. 10A is a side cross-sectional view of the electronic device structure after portions of the seed gapfill layer are removed according to some embodiments.
Figure 10B:
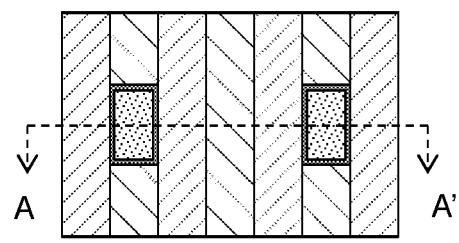
FIG. 10B is a top view of the electronic device structure shown in FIG. 10A.

FIG. 10A and FIG. 10B are views similar to FIG. 9A and FIG. 9B, respectively, after portions of the first metal film 701 are removed to expose top portions of the insulating layer 102 according to one embodiment. In some embodiments, portions the first metal film 701 are removed such that the first metal film 701 is coplanar with the top surface 601 of the electronic device. In some embodiments, the portions of the first metal film 701 are removed using one of the chemical-mechanical polishing (CMP) techniques known to one of ordinary skill in the art of microelectronic device manufacturing.

In some embodiments, the first metal film 701 is deposited within the trenches 302 without being deposited on the top surface 601 of the electronic device. In some embodiments, the trenches 302 are not completely filled by the first metal film 701, for example, as shown in the embodiment illustrated in FIG. 2B or 2C.

Figure 11A:
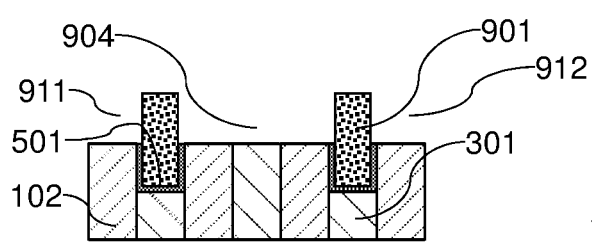
FIG. 11A is a side cross-sectional view of the electronic device structure after self-aligned selective growth pillars are formed according to some embodiments.
Figure 11B:
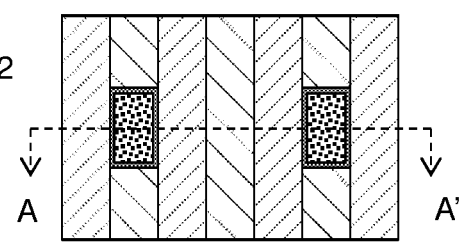
FIG. 11B is a top view of the electronic device structure shown in FIG. 11A.

FIGS. 11A and 11B are views similar to FIG. 10A and FIG. 10B, respectively, after self-aligned selective growth pillars (i.e., first metal oxide film 901) are formed using the first metal film 701 on the liner 501 on the recessed conductive lines 301 according to one or more embodiment. As shown in FIGS. 11A and 11B, an array of the first metal oxide films 901 has the same pattern as a portion of the conductive lines 301. As shown in FIGS. 11A and 11B, the pillars extend substantially orthogonally from the top surface 601 of the electronic device. As shown in FIGS. 11A and 11B, the pillars are separated by gaps 904.

In some embodiments, the pillars formed from the first metal oxide film 901 are selectively grown from the first metal film 701 on portions of the liner 501 on the conductive lines 103. In some embodiments, portions of the first metal film 701 above the conductive lines 103 are expanded for example, by oxidation, nitridation, or other process to grow pillars. In some embodiments, the first metal film 701 is oxidized by exposure to an oxidizing agent or oxidizing conditions to transform the first metal film 701 to metal oxide pillars. Those skilled in the art will understand that forming the pillar is done by an electrochemical oxidation and does not necessarily contain oxygen. In some embodiments, pillars include an oxide of one or more metals listed above. In more specific embodiment, pillars include tungsten oxide (e.g., WO, $WO_3$ or other tungsten oxides). In some embodiments, the pillars are a nitride.

The oxidizing agent can be any suitable oxidizing agent including, but not limited to, $O_2$, $O_3$, $N_2O$, $H_2O$, $H_2O_2$, CO, $CO_2$, $NH_3$, $N_2/Ar$, $N_2/He$, $N_2/Ar/He$ or any combination thereof. In some embodiments, the oxidizing conditions comprise a thermal oxidation, plasma enhanced oxidation, remote plasma oxidation, microwave and radio-frequency oxidation (e.g., inductively coupled plasma (ICP), capacitively coupled plasma (CCP)).

In some embodiments, the pillars of the first metal oxide film 901 are formed by oxidation of the first metal film 701 at any suitable temperature depending on, for example, the composition of the first metal film 701 and the oxidizing agent. In some embodiments, the oxidation occurs at a temperature in an approximate range of about 25 degrees C. to about 800 degrees C. In some embodiments, the oxidation occurs at a temperature greater than or equal to about 150° C. In some embodiments, the height of the pillars is in an approximate range from about 5 angstroms (Å) to about 10 microns (μm).

FIGS. 12A and 12B are views similar to FIGS. 11A and 11B, respectively, after an insulating layer 1001 is deposited to overfill the gap 904 between the pillars 901 as well as the regions 911, 912 adjacent to the pillars of the first metal oxide film 901 according to some embodiments. As shown in FIGS. 12A and 12B, insulating layer 1001 is deposited in the regions 911, 912 adjacent to the pillars and in the gap 904. The insulating layer 1001 may also be referred to as the second insulating layer and is comprised of a second insulating material. The second insulating layer 1001 can be any suitable dielectric material as described herein with regard to insulating layer 102.

In the embodiment shown in FIGS. 12A and 12B, the second insulating layer 1001 has a height greater than pillars. Stated differently, the thickness of the second insulating layer 1001 is sufficient to cover the pillars. In some embodiments, the second insulating layer 1001 is formed so that a top of the second insulating layer is substantially even with the pillars or slightly below the top of the pillars.

In some embodiments, insulating layer 1001 is a low-k gapfill layer. In some embodiments, insulating layer 1001 is flowable. In one embodiment, insulating layer 1001 is a flowable silicon oxide (FSiOx) layer. In some embodiments, insulating layer 1001 is an oxide layer, e.g., silicon dioxide, or any other electrically insulating layer determined by an electronic device design. In some embodiments, insulating layer 1001 is an interlayer dielectric (ILD). In some embodiments, insulating layer 1001 is a low-k dielectric that includes, but is not limited to, materials such as, e.g., silicon dioxide, silicon oxide, a carbon based material, e.g., a porous carbon film, carbon doped oxide ("CDO"), e.g., carbon doped silicon dioxide, porous silicon dioxide, porous silicon oxide carbide hydride (SiOCH), silicon nitride, or any combination thereof. In some embodiments, insulating layer 1001 is a dielectric material having k-value less than 3. In some embodiments, insulating layer 1001 is a dielectric material having k-value in an approximate range from about 2.2 to about 2.7. In some embodiments, insulating layer 1001 includes a dielectric material having k-value less than 2. In some embodiments, insulating layer 1001 represents one of the insulating layers described herein with respect to insulating layer 102.

In some embodiments, insulating layer 1001 is a low-k interlayer dielectric to isolate one metal line from other metal lines. In some embodiments, insulating layer 1001 is deposited using one of deposition techniques, such as but not limited to a CVD, spin-on, an ALD, PVD, MBE, MOCVD, or other low-k insulating layer deposition techniques known to one of ordinary skill in the art of microelectronic device manufacturing.

FIGS. 13A and 13B are views similar to FIGS. 12A and 12B, respectively, after chemical-mechanical planarization (CMP) of the insulating layer 1001 to expose the top 1101 of the pillars of the first metal oxide film 901 according to some embodiments. As shown, the insulating layer 1001 is removed such that the pillars are exposed while the insulating layer 1001 remains substantially coplanar with the top 1101 of the pillars. The CMP process can be any suitable planarization process known to those skilled in the art. In some embodiments, the insulating layer 1001 is deposited so that the top of the insulating layer 1001 is even with or slightly below the top 1101 of the pillars and the CMP process is not performed.

FIGS. 14A and 14B are views similar to FIGS. 13A and 13B, respectively, after the pillars of the first metal oxide film 901 are removed to form a gap 1201 via etch according to some embodiments. Etching of the pillars can be done by any suitable technique. In some embodiments, etching the pillars comprises exposing the pillars to an aqueous alkaline solution. The pillars are removed without affecting the liner 501 or the insulating layer 1001.

In an exemplary non-limiting process, the pillars comprise tungsten and are grown by reaction with oxygen to form the tungsten oxide pillars, which may take the form of $WO_3$. Exposure of $WO_3$ to KOH forms soluble $K_2WO_4$ and/or $WO_2Cl_2$ which leaves the surface until all tungsten oxide is removed. The reaction can spontaneously stop once the tungsten oxide portion (or metal oxide portion in general) is removed.

In the embodiment illustrated the liner 501 remains in the gap 1201. In some embodiments (not shown), the liner 501 is removed using one or more of the dry and wet etching techniques known to one of ordinary skill in the art of electronic device manufacturing.

FIGS. 15A and 15B are views similar to FIGS. 14A and 14B, respectively, after an insulating layer 1301 has been deposited on the insulating layer 1001 and in the gaps 1201 according to some embodiments. The insulating layer 1301 may be referred to as a third insulating layer and is comprised of a third insulating material. The third insulating layer 1301 can be any suitable dielectric that is different than the second insulating layer 1001 material as described herein with regard to insulating layer 102. The third insulating layer 1301 fills the gaps 1201 and contacts the liner 501 (as shown) or the recessed first conductive lines 301 (if no liner 501 is present).

FIG. 16A is a view 1300 and FIG. 16B is a view 1310 that are similar to FIGS. 15A and 15B, respectively, after gap-filling the gap 1201 with a third insulating layer 1301. The third insulating layer 1301 can be any suitable dielectric material that is different than the second insulating layer 1001. The third insulating layer 1301 fills the gap 1201 and contacts the liner 501 (as shown) or the recessed first conductive lines 301 (if no liner 501 is present).

FIGS. 17A and 17B are views similar to FIGS. 16A and 16B, respectively, after the insulating layer has been deposited and/or etched such that a predetermined depth remains according to some embodiments. In the embodiments shown, an overburden of the insulating layer 1301 is deposited as shown in FIGS. 15A and 15B and then removed to be coplanar with the second insulating layer 1001, as shown in FIGS. 16A and 16B, then redeposited to a predetermined depth, as shown in FIGS. 17A and 17B. In some embodiments, the insulating layer is deposited as shown in FIGS. 15A and 15B, and then removed to leave a predetermined depth as shown in FIGS. 17A and 17B. In some embodiments, the overburden can be removed by a chemical-mechanical planarization (CMP) process known to those skilled in the art.

In some embodiments, the insulating layer 1301 is deposited such that it is coplanar with the insulating layer 1001, as shown in FIGS. 16A and 16B, and then a predetermined depth of insulating layer 1301 is deposited again to establish a predetermined depth of insulating layer 1301, as shown in FIGS. 17A and 17B. Regardless of the specific method, a predetermined depth of insulating layer 1301 remains as shown in FIGS. 17A and 17B.

Figures 18A, 18B:
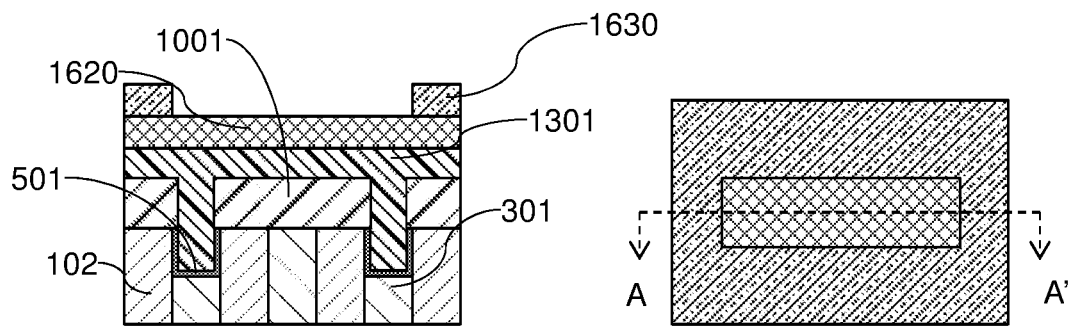
FIG. 18A is a side cross-sectional view of the electronic device structure after masking according to some embodiments.
FIG. 18B is a top view of the electronic device structure shown in FIG. 18A.

FIGS. 18A and 18B are views similar to FIGS. 17A and 17B, respectively, after a first mask 1620 and a second mask 1630 have been deposited on the insulating layer 1301 according to some embodiments. The first mask 1620 and the second mask 1630 may be the same or different than the first mask 201 and the second mask 202 disclosed elsewhere herein.

A first mask 1620 and a second mask 1630 are illustrated on the insulating layer 1301. The first mask 1620 is shown covering the all of the insulating layer 1301 and the second mask 1630 covers the area outside the area of the pillars and the gap 904 as shown in FIGS. 11A and 11B. The first mask 1620 and the second mask 1630 may be the same or different than the first mask 201 and the second mask 202 disclosed elsewhere herein. Those skilled in the art will recognize that the masking and insulator layers can be single or multiple layers.

The thickness of the insulating layer 1301 above the insulating layer 1001 (i.e. the depth of insulating layer 1301 not within the gap 1201) and the first mask 1620 is substantially the same.

Figures 19A, 19B:
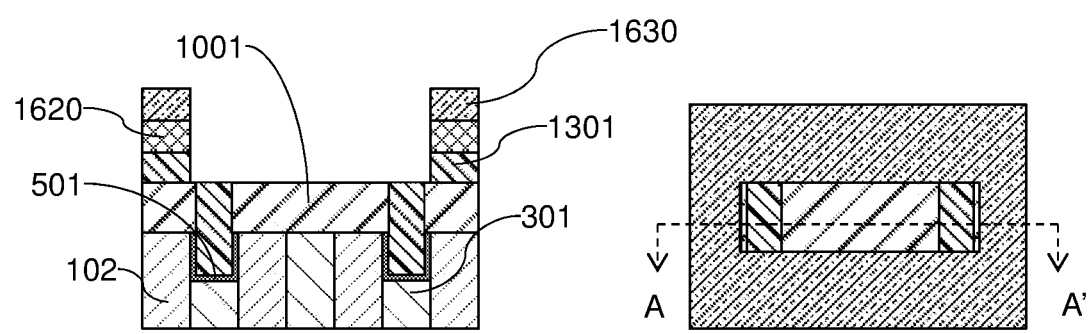
FIG. 19A is a side cross-sectional view of the electronic device structure after etching the third insulating layer to a known depth according to some embodiments.
FIG. 19B is a top view of the electronic device structure shown in FIG. 19A.

FIGS. 19A and 19B are views similar to FIGS. 18A and 18B, respectively, after an etch process isotropically removes a portion of the insulating layer 1301 that is not directly below mask 1630 according to some embodiments. After the isotropic removal, a portion of the insulating layer 1301 and portion of the insulating layer 1001 are exposed.

The insulating layer 1301, mask 1620 and mask 1630 can be removed by any suitable technique or combination of techniques. For example an etch process could selectively remove the insulating layer 1301, mask 1620 and mask 1630 without affecting insulating layer 1001. In some embodiments, more than one etch process is used to remove the insulating layer 1301, mask 1620 and mask 1630. For example, a first etch process can be used to remove mask 1630 and a second etch process can be used to remove mask 1620 and insulating layer 1301. In some embodiments, there are three etch processes used to remove the three layers with each etch process selective for one of the layers.

Figures 20A, 20B:
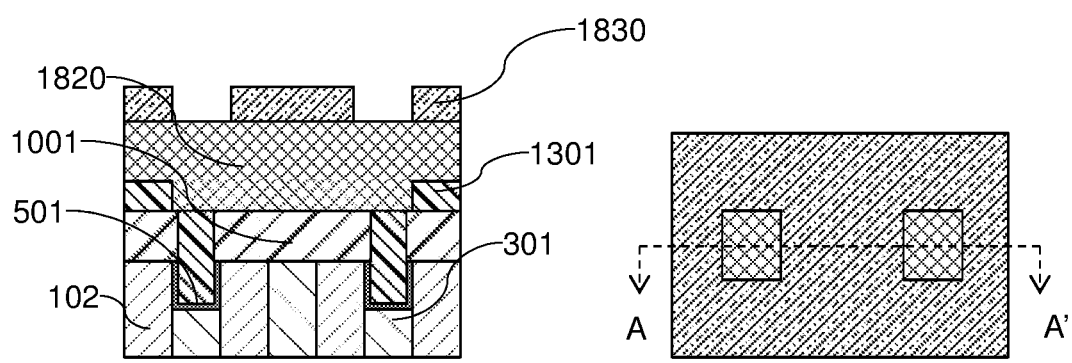
FIG. 20A is a side cross-sectional view of the electronic device structure after forming a stack and masking according to some embodiments.
FIG. 20B is a top view of the electronic device structure shown in FIG. 20A.

FIGS. 20A and 20B are views similar to FIGS. 19A and 19B, respectively, after the previous first mask 1620 and second mask 1630 are removed and a first mask 1820 and a second mask 1830 have been deposited on the insulating layer 1301 and the insulating layer 1001 according to some embodiments. The first mask 1820 and the second mask 1830 may be the same or different than the first mask 201 and the second mask 202 and/or the first mask 1620 and the second mask 1630 disclosed elsewhere herein. Those skilled in the art will recognize that the masking and insulator layers can be single or multiple layers.

A first mask 1820 and a second mask 1830 are illustrated on the insulating layer 1301 and the insulating layer 1001. The first mask 1820 is shown covering all of the insulating layer 1301 and the insulating layer 1001. The second mask 1830 is shown covering a similar area to the mask 202 shown in FIGS. 4A and 4B. Those skilled in the art will recognize that the masking and insulator layers can be single or multiple layers. The thickness of the additional first mask 1830 and the insulating layer 1301 within the gap 1201 is substantially the same.

Figures 21A, 21B:
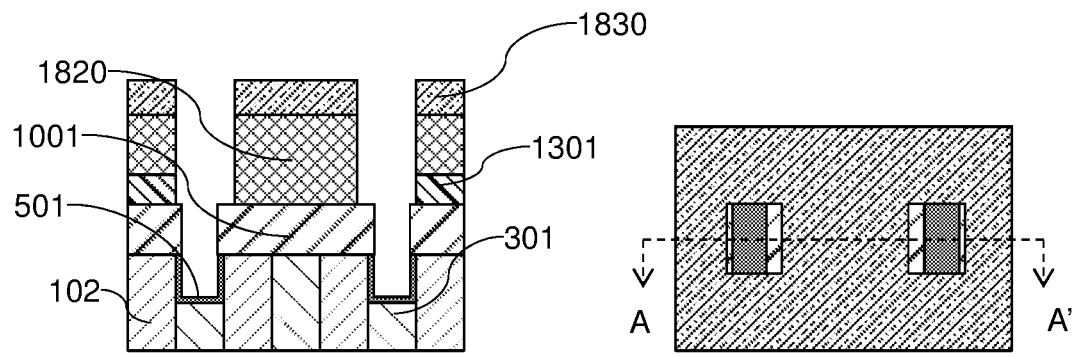
FIG. 21A is a side cross-sectional view of the electronic device structure after etching the third insulating layer to form vias according to some embodiments.
FIG. 21B is a top view of the electronic device structure shown in FIG. 21A.

FIGS. 21A and 21B are views similar to FIGS. 20A and 20B, respectively, after an etch process isotropically removes the insulating material 1301 that is not directly below mask 1830 according to some embodiments.

Figures 22A, 22B:
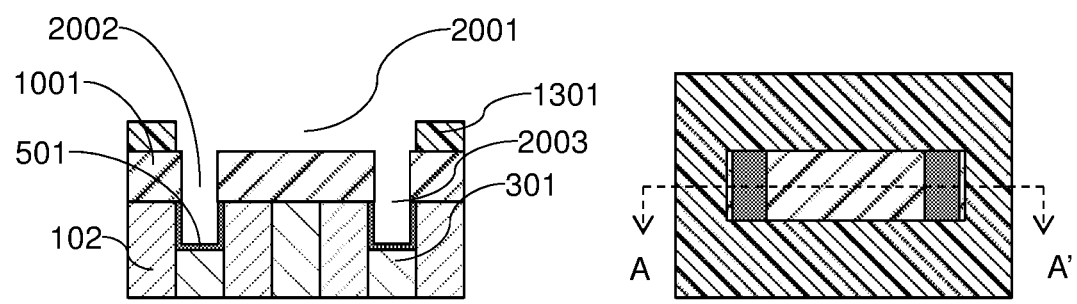
FIG. 22A is a side cross-sectional view of the electronic device structure after a mask layer is removed according to some embodiments.
FIG. 22B is a top view of the electronic device structure of FIG. 22A.

FIGS. 22A and 22B are views similar to FIGS. 21A and 21B, respectively, after mask 1820 and mask 1830 are removed according to some embodiments. After the removal of the mask layers, a portion of the insulating layer 1301, a portion of the insulating layer 1001 and portion of the liner 501 are exposed.

The insulating layer 1301, mask 1820 and mask 1830 can be removed by any suitable technique or combination of techniques. For example an etch process could selectively remove the insulating layer 1301, mask 1820 and mask 1830 without affecting insulating layer 1001. In some embodiments, more than one etch process is used to remove the insulating layer 1301, mask 1820 and mask 1830. For example, a first etch process can be used to remove mask 1830 and a second etch process can be used to remove mask 1820 and insulating layer 1301. In some embodiments, there are three etch processes used to remove the three layers with each etch process selective for one of the layers. Regardless of the number of etch processes, removal of the insulating layer 1301 and the mask 1820 creates a trench 2001 and vias 2002, 2003.

Trench 2001 extends in a second direction that is different from the first direction of the first conductive lines 103. In the embodiment shown, the first conductive lines 103 extend along the x-axis and the trench 2001 extends along the y-axis. In some embodiments, the second direction is at an angle to the first direction in the range of about 30° to about 150°, or in the range of about 50° to about 130°, or in the range of about 70° to about 110°, or in the range of about 80° to about 100°, or in the range of about 85° to about 95°, or in the range of about 87° to about 93°, or in the range of about 89° to about 91°.

Figures 23A, 23B:
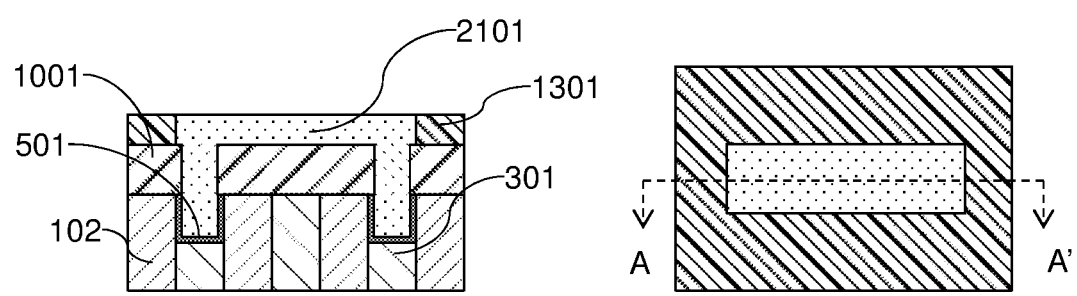
FIG. 23A is a side cross-sectional view of the electronic device structure after forming second conductive lines and filling the vias according to some embodiments.
FIG. 23B is a top view of the electronic device structure shown in FIG. 23A.

FIGS. 23A and 23B are views similar to FIGS. 22A and 22B, respectively, after deposition of second conductive material to form a second conductive line 2101 in the vias 2002, 2003 and trench 2001 according to some embodiments. The second conductive line 2101 can be any suitable metal and can be deposited by any suitable deposition technique. The second conductive line 2101 extends in the second direction which is different than the first direction of the first conductive line 103, as described herein.

Figure 24:
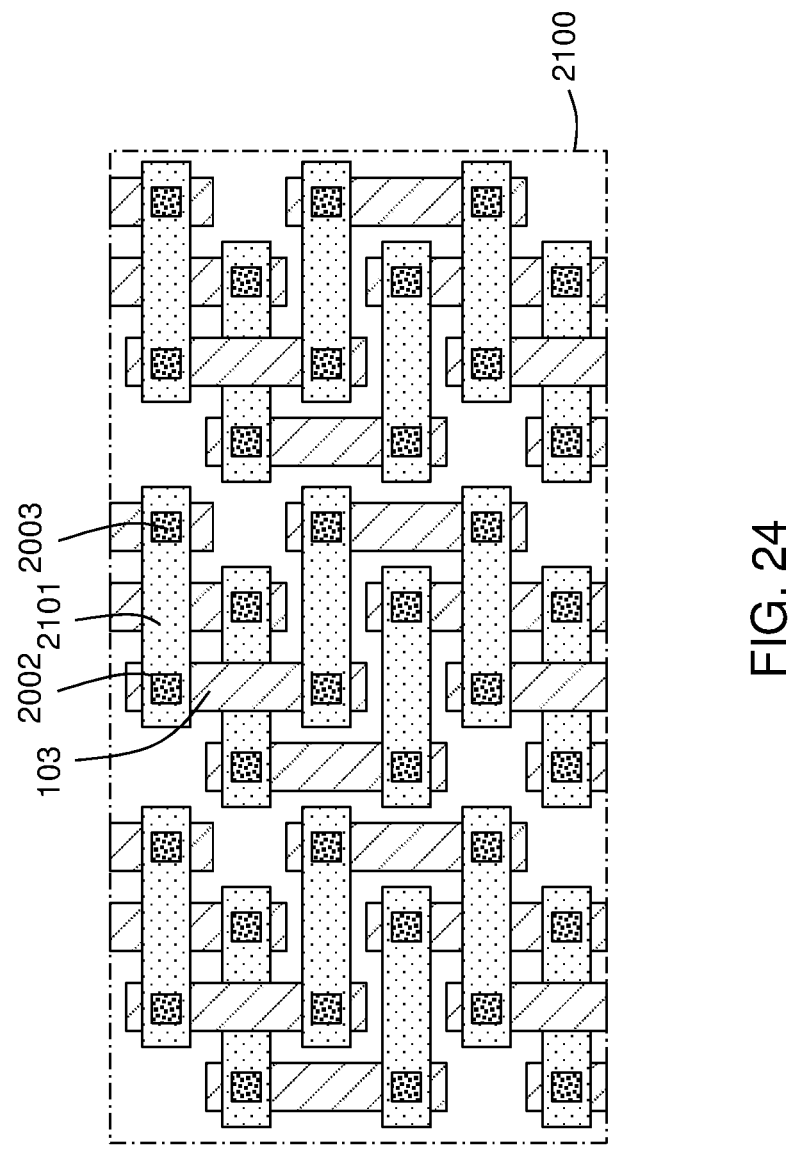
FIG. 24 shows a portion of an electronic device with self-aligned vias in accordance with one or more embodiment of the disclosure.

FIG. 24 shows a portion of a device 2100 with the self-aligned vias in a nested structure. The first conductive lines 103 extend vertically in the diagram and the second conductive lines 2101 extend horizontally on the page. Vias 2002, 2003 are illustrated where the connections between the first conductive lines 103 and the second conductive lines 2101 occur. The packing and arrangement of the conductive lines and vias can be tighter (i.e., higher density) or looser (i.e., lower density) than the embodiment illustrated.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method comprising:
providing a substrate in a reaction chamber, the substrate having a dielectric substrate surface with at least one feature formed therein, the at least one feature extending a distance from the substrate surface into the substrate and having a sidewall and a bottom, the at least one feature having a first metal film comprising a first metal therein and a first metal oxide film on the first metal film, the first metal oxide film comprising the first metal, wherein the first metal film is partially oxidized to form the first metal oxide film on the first metal film; and
exposing the substrate to an aqueous alkaline solution to remove the first metal film and the first metal oxide film from the feature without affecting the substrate surface adjacent to the feature, the aqueous alkaline solution comprising one or more of NaOH and KOH and having a hydroxide concentration of less than or equal to about 0.1 M,
wherein no plasma is used and wherein the reaction chamber is not purged.

2. The method of claim 1, wherein the first metal comprises tungsten.

3. The method of claim 1, wherein the at least one feature further comprises a liner and the first metal oxide film is on the liner and exposure to the aqueous alkaline solution does not affect the liner.

4. The method of claim 3, wherein the liner comprises one or more of SiN or SiCN.

5. The method of claim 3, wherein the at least one feature further comprises a second metal film having a second metal below the liner.

6. The method of claim 5, wherein the second metal is different from the first metal.

7. The method of claim 6, wherein the second metal comprises one or more of copper, cobalt, and ruthenium.

8. The method of claim 1, wherein the aqueous alkaline solution comprises a base with a pKb of less than or equal to about 5.

9. The method of claim 1, wherein the substrate is exposed to the aqueous alkaline solution at atmospheric pressure.

10. The method of claim 1, wherein the substrate is maintained at a temperature in a range of about 50° C. to about 250° C.

11. The method of claim 1, wherein the at least one feature has an aspect ratio of greater than or equal to about 10:1.

12. The method of claim 1, further comprising rinsing the substrate with an aqueous solution.

13. A method comprising:
providing a substrate in a reaction chamber, the substrate having a substrate surface with at least one feature formed therein, the at least one feature extending a distance from the substrate surface into the substrate and having a sidewall and bottom, the at least one feature having an aspect ratio greater than or equal to about 10:1, the at least one feature having a tungsten film therein and a tungsten oxide film on the tungsten film, wherein the tungsten film is partially oxidized to form the tungsten oxide film on the tungsten film;
exposing the substrate to an aqueous hydroxide solution to remove the tungsten film and the tungsten oxide film from the feature without affecting the substrate surface adjacent to the feature, the aqueous hydroxide solution comprising one or more of NaOH and KOH and having a hydroxide concentration of less than or equal to about 0.1 M; and rinsing the substrate with a solution comprising water and isopropyl alcohol, wherein no plasma is used and wherein the reaction chamber is not purged.

14. A method to provide a self-aligned via, the method comprising:

providing a substrate in a reaction chamber, the substrate having a plurality of first conductive lines between a plurality of first insulating layers which are substantially coplanar and extend along a first direction;

recessing portions of the first conductive lines;

depositing a liner on the recessed portions of the first conductive lines;

forming a first metal film on the liner;

partially oxidizing the first metal film to form pillars comprising an oxide of the first metal film;

depositing a second insulating layer around the pillars; and removing the pillars to form vias in the second insulating layer by exposing the substrate to an aqueous alkaline solution to remove the pillars and the first metal film without affecting the first insulating layers, the liner or the second insulating layer, the aqueous alkaline solution comprising one or more of NaOH and KOH and having a hydroxide concentration of less than or equal to about 0.1 M, wherein no plasma is used and wherein the reaction chamber is not purged.

15. The method of claim 14, further comprising removing the liner after either the pillars are removed from the vias.

16. The method of claim 14, further comprising:

depositing a third insulating layer in the vias and on the second insulating layer to form filled vias and an overburden of third insulating layer;

removing a portion of the overburden of the third insulating layer and the third insulating layer from the filled vias to form via openings;

depositing a second conductive material into the via opening; and depositing a second conductive line on the second insulating layer and in contact with the second conductive material in the via opening, the second conductive line extending along a second direction on the second insulating layer, the second direction crossing the first direction at an angle in a range of about 30° to about 150°.

* * * * *